United States Patent

Rideout

[15] 3,656,034

[45] Apr. 11, 1972

[54] INTEGRATED LATERAL TRANSISTOR HAVING INCREASED BETA AND BANDWIDTH

[72] Inventor: Arthur J. Rideout, Poughkeepsie, N.Y.

[73] Assignee: International Business Machines Corporation, Armonk, N.Y.

[22] Filed: Jan. 20, 1970

[21] Appl. No.: 4,373

[52] U.S. Cl. .....................317/235 R, 317/235 F, 317/235 Y, 148/175

[51] Int. Cl. .........................................................H01l 11/06

[58] Field of Search ..................................317/235, 299, 303

[56] References Cited

UNITED STATES PATENTS 3,299,281 1/1967 Cluwen.................................317/235

3,506,893 4/1970 Dhaka...................................317/235

FOREIGN PATENTS OR APPLICATIONS 1,541,490 8/1968 France..................................317/235

OTHER PUBLICATIONS

IBM Tech. Discl. Bul., " Light- Activated Semiconductor Switch" by Pieczonka, Vol. 7, No. 7, Dec. 1964, pp. 618- 619

Proceedings of the IEEE, " Lateral Complementary Transistor Structure for the Simultaneous Fabrication of Functional Blocks" by Lin et al., Dec. 1964, pp. 1491- 1495

*Primary Examiner*—Jerry D. Craig

*Attorney*—Hanifin and Jancin and J. Jancin, Jr.

[57] ABSTRACT

An integrated lateral transistor which is easily made symmetrical. An NPN embodiment is constructed on a P— substrate which forms PN junctions with an adjacent N+ buried region and an N epitaxial region within which the N+ region is located. Integral with the substrate is a P+ isolation region which extends to the upper surface of the semiconductor to isolate the N epitaxial layer from adjacent devices. A base region is diffused into the epitaxial region to form a PN junction with the N+ buried region. N+ emitter and collector regions are diffused into the P type base region until the junctions they form with the base are within much less than one diffusion length of the base-buried region PN junction. The emitter and collector are also within two minority carrier diffusion lengths of each other. A similar PNP embodiment is also disclosed.

4 Claims, 6 Drawing Figures

Patented April 11, 1972 3,656,034

INVENTOR
ARTHUR J. RIDEOUT

BY J. Tanecin Jr.
ATTORNEY

INTEGRATED LATERAL TRANSISTOR HAVING INCREASED BETA AND BANDWIDTH

BACKGROUND OF THE INVENTION

1. Field of the Invention

The invention relates to the field of integrated circuits and more particularly to the field of integrated lateral transistors.

2. Description of the Prior Art

It is known in the prior art to diffuse both the emitter and collector of a lateral transistor into a first side of the base. It is also known to make a second side of the base — that side opposite the first side — of higher conductivity than the remainder of the base, in order to reduce base resistance. In such devices the emitter current flows directly from the emitter to the collector through a low conductivity portion of the base, while the base current flows from the base contact through the high conductivity portion of the base to reach the active base region. That portion of the emitter current which is not injected toward the collector must recombine in the base. This produces an undesireable characteristic in which an increase in the base current results in a lowering of the beta of the transistor.

The prior art also contains devices having multiple emitters and collectors in which a fourth region adjacent the second side of the base is of the opposite conductivity type to that of the base. This arrangement establishes a current flow pattern from the emitters to the fourth region and from the fourth region to the collectors. These prior art devices are threatened with having a low beta as a result of side injected emitter current which recombine in the base region. In order to avoid the cumulative beta degrading effect of this side injected current, prior art devices etch away the material adjacent the sides of the emitters.

In prior art symmetrical lateral transistors, the emitter and collector regions are parallel rectangles. This structure has the disadvantage of having a low beta because a small percentage of the emitter injected current reaches the collector. This is the result of injection from the lateral surfaces of the emitter which are not adjacent to the collector and from the lower surface of the emitter. This prior art arrangement results in a reduction in the useful bandwidth of the transistor because the decreased beta lowers the frequency at which the beta becomes unity. In nonsymmetrical prior art lateral transistors, the problem of low beta is partially eliminated by having the collector surround the emitter in a plane parallel to the upper surface of the device. In this way the collector is in a position to collect the current injected by the lateral surfaces of the emitter. However, even in this configuration, the current injected by the lower surface of the emitter must recombine in the base, thus reducing beta.

OBJECTS OF THE INVENTION

The primary object of the invention is to increase the beta and the bandwidth of an integrated lateral transistor.

Another object of the invention is to provide an increased beta and bandwidth in an integrated lateral transistor which may be easily fabricated using present fabrication steps.

SUMMARY OF THE INVENTION

To achieve the objects of the present invention, a buried region of the same conductivity type as the emitter and collector is provided. The buried region is heavily doped to have a high conductivity. The base region is diffused into the semiconductor material and forms a PN junction with the buried region. The emitter and collector regions are preferably diffused into the base simultaneously. The depth of these diffusions are closely controlled in order to obtain the desired separation of less than one minority carrier diffusion length between the buried region and the emitter and collector regions. The emitter and collector are also within several minority carrier diffusion lengths of each other. In this device the current flows from the emitter to the buried layer and from the buried layer to the collector as well as directly from the emitter to the collector.

The beta of the transistor is determined by the separation among the emitter, collector, and the buried regions.

DESCRIPTION OF THE DIAGRAMS:

Figure 2:
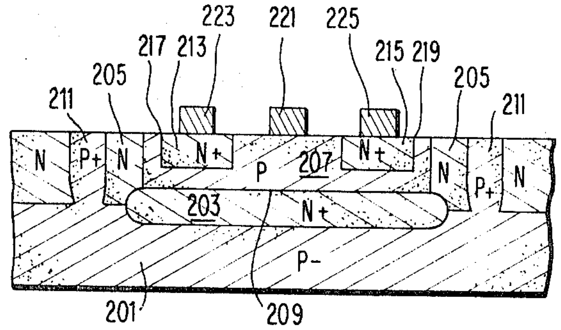
FIG. 2 is a cross-section taken along the line 2—2 of FIG. 1 showing the relationship of the emitter, collector, and buried regions.
Figure 4A:
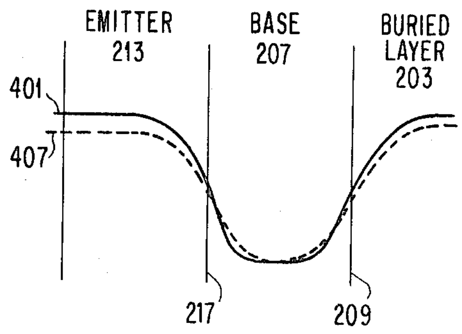
Figure 4B:
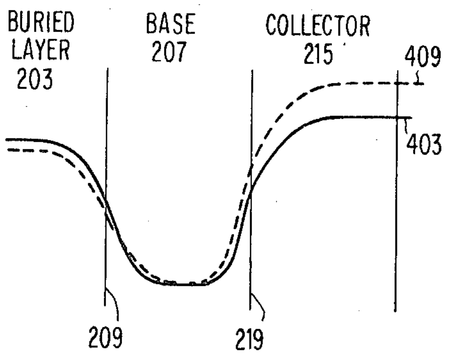
Figure 4C:
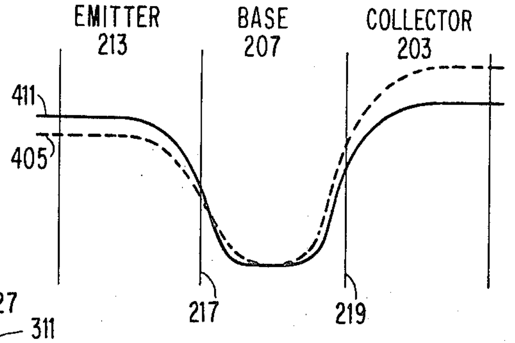

FIGS. 4*a*, 4*b*, and 4*c* show the electrostatic potentials of the device of FIG. 2 under various bias conditions.

DESCRIPTION OF THE INVENTION:

For purposes of this invention, a symmetrical transistor is one in which the forward characteristics are identical to the reverse characteristics. That is, the forward beta and the reverse beta are the same. Symmetrical transistors are widely used in switching and other circuits.

Also, for purposes of this invention an integrated transistor is one which is fabricated in the same chip with other devices and which is used while still part of a chip containing other devices to which it is connected.

Throughout this specification the surface of the structure from which the diffusions are made is referred to as the upper or top surface. The sides are referred to as lateral surfaces.

FABRICATION

In order to fabricate a transistor as shown in FIG. 2, a P-type substrate 201 is prepared for diffusion. The substrate is then masked in a conventional manner with an opening where the N+ buried region 203 is to be located. An N-type impurity is diffused into the P-type substrate through the opening in the mask. After the diffusion step and the removal of the mask, the N-type epitaxial layer 205 which will form an inner isolation region, is grown over the entire surface of the P substrate 201 and the buried region 203. During the growth of this epitaxial layer the doping in the region 203 out diffuses into the adjacent area of the N-type epitaxy as well as deeper into the P-type substrate 201. After the growth of the epitaxy, the structure is masked with an opening for the diffusion of the outer isolation region 211. The region 211 is doped heavily P-type by diffusing a high concentration of P-type impurity through the opening in the mask. The structure is now remasked with an opening for the base to be diffused. P-type impurity is diffused into the N-type epitaxial region through the base opening and is diffused to the surface of the buried N+ region 203. The P-type base diffusion should reach the surface of the region 203. If the base region does not diffuse to the buried region, the performance of the structure will be somewhat degraded. The structure is again remasked with openings for the emitter and collector regions. N-type impurity is diffused through these openings to form the heavily doped N-type emitter and collector regions. These regions must be diffused to within one minority carrier diffusion length, preferably much less than one diffusion length, of the buried region 203 and to within several diffusion lengths to each other, preferably within two diffusion lengths. The separation among these diffusions and the buried layer is critical, since this is what largely determines the beta of the transistor. The structure is again remasked with openings for the base, emitter and collector contacts. The contacts are then applied. Each of the individual steps above enumerated is well known in the art and can be carried out by well known means. Preferably the emitter and collector regions are diffused simultaneously. If simultaneously diffused, these two areas will be equal in impurity concentration and diffusion depth.

The following process was used for the construction of a successful device. A P- substrate doped with boron was prepared for diffusion. The buried layer was diffused at a temperature of 1108°C. for 150 minutes using arsenic as the dopant. The surface of the structure was then oxidized at a temperature of 1200°C. Dry oxygen was used for 60 minutes followed by steam for 20 minutes followed by dry oxygen for 5 minutes. This yielded an oxide coating of 5500 A. Next an arsenic doped epitaxial layer was grown with a thickness of 4.25 microns. This region had a resistivity of 1.30 ohms. Next an oxide layer was grown over the surface at 970°C. using 15 minutes of dry oxygen followed by 90 minutes of steam followed by 5 minutes of dry oxygen, which yielded an oxide layer 4500 A thick. Next the isolation diffusion was made at a temperature of 1200°C. for a period of 90 minutes using boron as the dopant. The surface was then stripped and reoxidized at 1150°C. with 5 minutes of dry oxygen followed by 15 minutes of steam followed by 5 minutes of dry oxygen yielding an oxide layer 3300 A thick. The base was doped with boron, which was deposited on the surface at a temperature of 1000°C. for 35 minutes using a vapor source. The structure was then held at 1100°C. for reoxidation and drive in using dry oxygen for 5 minutes followed by steam for 10 minutes followed by dry oxygen for 3 minutes which yielded an oxide layer 2300 A thick. The emitter and collector were then deposited at 970°C. using phosphorous as the dopant, using a 5 minute preflush of inert gas followed by 30 minutes of phosphorous containing gas followed by a 5 minute flush of inert gas. The emitter and collector were then driven in at a temperature of 900°C. while exposed to dry oxygen for 5 minutes, steam for 45 minutes and dry oxygen for 25 minutes.

This produced a device having a beta of 5 with a bandwidth of more than 100 megacycles. The emitter and collector were about 0.05 diffusion lengths from the buried layer, and about 1.5 diffusion lengths from each other.

STRUCTURE

Figure 1:
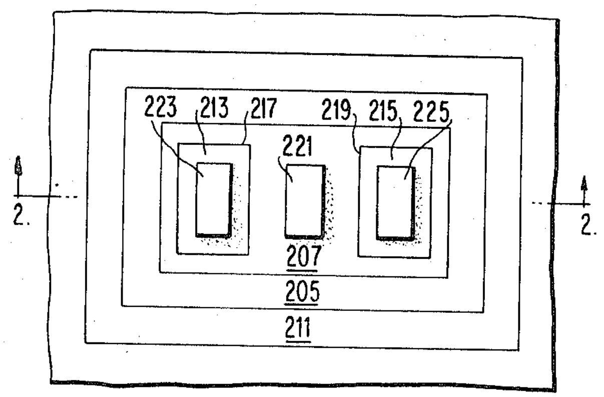
FIG. 1 is a plane view of an NPN embodiment of the present invention.

A preferred NPN embodiment of this invention is shown in FIGS. 1 and 2. In FIG. 2 the substrate 201 is lightly doped P-type material. Contiguous to part of the upper surface of the substrate is buried layer 203 of heavily doped N-type material. An N-type epitaxial region 205 which forms an inner isolation region is contiguous to another part of the upper surface of the substrate 201, to part of buried region 203 and extends to the upper surface of the semiconductor. Contiguous to part of the upper surface of the buried region 203 is a P-type base region 207. PN junction 209 is formed by the junction of buried region 203 and base region 207. The base region 207 is contiguous to one of the lateral surfaces of inner isolation region 205. The PN junction formed by the junction of region 205 and base region 207 is continuous with junction 209. The other lateral surface of the inner isolation region 205 is contiguous to and forms a PN junction with the P-type outer isolation region 211. Outer isolation region 211 is contiguous to the substrate 201 and extends to the upper surface of the structure. Region 211 and substrate 201 form an isolation pocket around the transistor. Symmetrical emitter and collector regions 213 and 215 respectively, are diffused into the base region 207. The base-emitter junction is 217 and the base-collector junction is 219. The surface having the largest area of both the emitter and collector regions is parallel to the upper surface of the structure and to the upper surface of the buried region 203. The emitter and collector regions are separated from the buried region 203 by less than one minority carrier diffusion length. A base contact 221 is applied to the base region 207. Emitter contact 223 is applied to the emitter region 213 and collector contact 225 is applied to the collector region 215.

OPERATION

When the device is operating in the active mode and in the normal configuration, minority carriers are injected into the base region by the emitter. Because a major portion of the base-emitter junction is horizontal, many of the injected minority carriers traverse the base vertically. Because the separation between the emitter and the buried layer is so small, much less than one minority carrier diffusion length, most of the carriers, which traverse the base vertically are collected by the depletion layer field of junction 209. The collection of these minority carriers by the buried region 203 biases the junction 209 forward. Because of junction 209's forward bias, the buried region 203 reinjects the collected carriers into the base region 207. The reinjected carriers are collected by both the emitter junction 217 and the collector junction 219, because both the emitter and collector regions are sinks for the base region minority carriers. Most of the current injected toward the collector by the lateral surfaces of the emitter is collected by the collector through direct transistor action. Therefore, in a nonsymmetrical version where the collector surrounds the base in a plane parallel to the upper surface of the device all the current injected by the emitter travels toward a region where it will be usefully collected. The beta of the transistor is determined by the collection efficiency of the buried region with respect to the minority carriers injected by the emitter, by the collector's collection efficiency with respect to the carriers reinjected by the buried region and by the collector's efficiency in collecting the carriers injected by the emitter which travel horizontally. These collection efficiencies are dependent on the separation among the buried region, the emitter and the collector. Therefore, the depth of the emitter and collector diffusions and their separation from each other and the buried region are critical in determining the beta of the transistor. The collection efficiencies and thus the beta of the transistor are also dependent on the size and shape of the emitter 213, the collector 215, and the buried region 203 and on their doping levels. Varying the separation between the buried region 203 and the emitter 213 and collector 215 will vary the beta of the transistor as will varying the separation between the emitter and the collector.

In the prior art device which has a buried layer of the same conductivity type as emitter and collector, the emitter and collector are widely separated. In this invention, the emitter and collector are fabricated in close proximity in order to increase the bandwidth and the beta of the transistor. This close proximity results in a first component of beta equal to the beta of the prior art lateral transistors. The emitter-to-buried-region-to-collector current flow pattern converts into useful collector current some of the current which in the prior art lateral devices recombined in the base region. This conversion causes an increase in the beta of the device because of a resulting reduction in the amount of base current necessary to sustain a given collector current.

FIGS. *4a*, *4b*, and *4c* are diagrams of the electric potentials in the base 207, emitter 213, collector 215 and the region 203 of the device of FIG. 2. The solid lines 401, 403, and 405 indicate the equilibrium potentials. The dotted lines 407, 409, and 411 indicate the potentials when the transistor is operating in the active region. Forward biasing the base-emitter junction 217 reduces the potential in the N+ emitter region 213. This causes a forward flow of electrons from the N+ emitter region to the P-type base region. These injected minority carriers traverse the base and are collected by the N+ buried layer 203 across the PN junction 209 or the collector across PN junction 219, or recombine in the bases. The collection of electrons in the buried region is dependent on the separation between the buried region 203 and the emitter 213. Collection by the collector 215 is dependent on the separation between the emitter 213 and the collector 215. The collection of carriers by the buried region lowers its potential because of the excess of negative charge collected. This forward biases the PN junction 209. Therefore, the buried region injects electrons back into the base region. The electrons injected near the emitter 213 are collected by the emitter junction 217 and those injected near the collector 215 are collected by the reverse-biased collector junction 219. The electrons not collected by either junction 217 or 219 recombine in the base. The reverse bias of the collector junction 219 results from an increase in the potential in the collector region 215, which is applied when the transistor is operating in the active region.

The potential in the buried N+ region 203 will be between that of the emitter 213 and that of equilibrium potential in the buried region 203. The buried region 203 acts as a collector relative to the emitter 213 and as an emitter relative to the collector 215.

The collector current has two components, the first being due to carriers which travel directly from the emitter to the collector, and the second being due to the carriers which travel from the emitter to the collector by way of the buried region.

A contact can also be applied to region 205 or 203. This contact enables the gain of the transistor to be controlled by varying the potential on the buried region 203.

Figure 3:
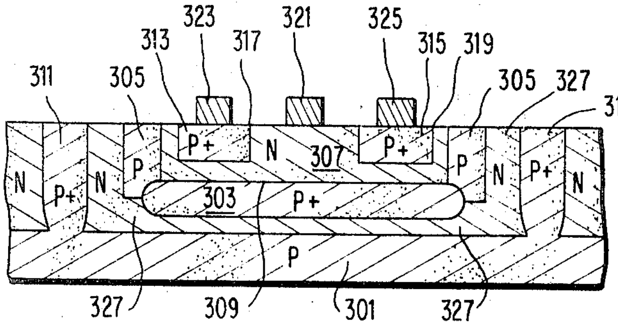
FIG. 3 is a cross-section of a PNP embodiment similar to the NPN embodiment of FIG. 2 showing a similar relationship.

Referring to FIG. 3, a PNP constant gain embodiment similar to the NPN embodiment of FIG. 2 is shown. The regions and contacts 301–325 of FIG. 3 correspond to the regions and contacts 201–225 of FIG. 2, respectively. The plan view of this embodiment is similar to that in FIG. 2 except that a middle isolation region 327 has been added between inner isolation region 305 and outer isolation region 311. Because FIG. 3 is a PNP embodiment and FIG. 2 is a NPN embodiment, the conductivity type of regions 303, 305, 307, 313, and 315 is the reverse of the conductivity type of the corresponding regions in FIG. 2. The middle isolation region 327 located between regions 301, 311 and regions 303, 305 is added to assure isolation of the transistor from other circuits. This is necessary because the P+ outer isolation diffusion 311 is not effective to isolate the inner isolation region 305 from other devices without the addition of region 327.

The embodiment of FIG. 3 is constructed in the following way. A P-type substrate is prepared and an N-type epitaxial region is grown thereon. This epitaxial layer is masked with an opening in the location where outer isolation region 311 is to be formed. A high concentration of P-type impurity is diffused through the openings in the mask. The diffusion is carried out until the P-type region being formed is firmly joined to the P-type substrate. The structure is then remasked with a hole where the buried region 303 is to be formed. A high concentration of P-type impurity is diffused through this opening. The mask is removed and a P-type epitaxial layer is grown over the entire surface of the structure. The structure is then masked with an opening where the N-type isolation region 327 will be formed. N-type impurity is diffused through the openings in this mask until the N-type region being formed is firmly attached to the N epitaxial region previously grown. This structure is again remasked with an opening for the base region 307. N-type impurity is diffused through an opening in the mask until it contacts the P+ region 303. The structure is again remasked with openings for the emitter 313 and the collector 315. Heavy concentrations of P-type impurity are diffused through these openings. The emitter and collector regions are diffused into the structure until the desired base width of much less than one minority carrier diffusion length between the buried region and the emitter and collector is formed. The structure is again remasked with openings for the emitter contact 323, the base contact 321 and collector contact 325. These contacts are then applied. Each of the individual steps above is well known in the art, as are acceptable methods of performing them.

The operation of the embodiment of FIG. 3 is identical to that of the NPN embodiment of FIG. 2 except that the minority carriers in the base are holes instead of electrons and therefore the device must bias as a PNP transistor.

By providing both a buried layer of the same conductivity type as emitter and collector within less than one minority carrier diffusion length of the emitter and collector and by placing the emitter within two or three minority carrier diffusion lengths of the collector the beta and bandwidth of the transistor are increased. This construction retains the benefits of the prior art lateral transistor in which the signal current flowed horizontally, while adding the benefits obtained in the prior art multiple collector, multiple emitter device, while retaining a structure which can be fabricated by present integrated techniques.

There are several variations which may be made in the devices described in this specification which will not degrade the performance of the device and are intended to be included within the scope of this invention. The buried region 303 may be entirely separated from the substrate by the epitaxial inner isolation region 305. The buried region 203 may extend to the outer isolation region 211, thus separating the epitaxial inner isolation region 205 from the substrate 201.

While the preferred embodiments have been discussed and described and some variations thereon have been mentioned, it will be clear to those skilled in the art that various changes in conductivity levels and shapes of regions can be made without departing from the invention herein described and claimed.

I claim:

1. An integrated lateral transistor structure having a base, an emitter and a collector comprising:
   a substrate having an upper surface, the base region extending to an upper surface of the structure, and an outer isolation region all of a first conductivity type;
   a buried region, an inner isolation region, and the emitter, and the collector all of a second conductivity type;
   the outer isolation region being contiguous to the substrate and extending to the upper surface of the structure to prevent interference from other devices;
   the buried region being above a portion of the substrate;
   the inner isolation region being contiguous to the buried region and extending to the upper surface of the structure to prevent interference from other devices;
   the buried region and the inner isolation region being entirely within the region bounded by the substrate, the outer isolation region and the upper surface of the structure;
   the base being entirely within the region bounded by the buried region, the inner isolation region, and the upper surface of the structure;
   the emitter and collector regions being separated from each other, being located in the base region, extending to the upper surface of the structure, extending down into the base to within one minority carrier diffusion length of the buried region, the distance between the emitter and collector regions being less than three minority carrier diffusion lengths to allow direct transistor action there between.

2. An integrated lateral transistor structure having a base, an emitter, and a collector comprising:
   a substrate having an upper surface, the base region extending to an upper surface of the structure, and an outer isolation region all of a first conductivity type;
   a buried region, an inner isolation region, and the emitter and the collector all of a second conductivity type;
   the outer isolation region being contiguous to the substrate and extending to the upper surface of the structure to prevent interference from other devices;
   the buried region being contiguous to a portion of the substrate and having an upper surface;
   the inner isolation region being contiguous to the buried region and to the outer isolation region, and extending to the upper surface of the structure;
   the buried region and the inner isolation region being entirely within the region bounded by the substrate, the outer isolation region and the upper surface of the structure;
   the emitter and collector regions being separated from each other, being located in the base region, extending to the upper surface of the structure, extending down into the base to within one minority carrier diffusion length of the buried region, the distance between the emitter and collector regions being less than three minority carrier diffusion lengths to allow direct transistor action there between.

3. An integrated lateral transistor structure having a base, an emitter, and a collector comprising:
   a substrate having an upper surface, an inner isolation region, an outer isolation region, a buried region, and the emitter and the collector, all of a first conductivity type;

the base region and a middle isolation region both of a second conductivity type;

the outer isolation region contiguous to the upper surface of the substrate and extending to an upper surface of the structure to prevent interference from other devices;

the middle isolation region being contiguous to the upper surface of the substrate and to the outer isolation region, extending to the upper surface of the structure to prevent interference from other devices, and being entirely within the region bounded by the substrate, the outer islation, and the upper surface of the structure;

the buried region being above a portion of the inner isolation region;

the inner isolation region being contiguous to the buried region, extending to the upper surface of the structure, and being entirely within the region bounded by the middle isolation region and the upper surface of the structure;

the base of the transistor extending to the upper surface of the structure, and being entirely within the region bounded by the buried region, the inner isolation region, and the upper surface of the structure;

the emitter and collector regions being separated from each other, being located in the base region, extending to the upper surface of the structure, extending down into the base to within one minority carrier diffusion length of the buried region, the distance between the emitter and collector regions being less than three minority carrier diffusion lengths to allow direct transistor action there between.

4. An integrated lateral transistor structure having a base, an emitter and a collector comprising:

a substrate having an upper surface, an inner isolation region, an outer isolation region, a buried region, and the emitter region and the collector region all of a first conductivity type;

the base region and a middle isolation region both of a second conductivity type;

the outer isolation region being contiguous to the upper surface of the substrate and extending to an upper surface of the structure to prevent interference from other devices;

the middle isolation region being contiguous to the upper surface of the substrate and to the outer isolation region, extending to the upper surface of the structure to prevent interference from other devices, and being entirely within the region bounded by the substrate, the outer isolation region, and the upper surface of the structure;

the buried region being contiguous to a portion of the middle isolation region, and having an upper surface;

the inner isolation region being contiguous to the buried region and the middle isolation region, extending to the upper surface of the structure and being entirely within the region bounded by the middle isolation region and the upper surface of the structure;

the base of the transistor being contiguous to the upper surface of the buried region, extending to the upper surface of the structure, and being entirely within the region bounded by the buried region, the inner isolation region, and the upper surface of the structure;

the emitter and collector regions being separated from each other, being located in the base region, extending to the upper surface of the structure, extending down into the base to within one minority carrier diffusion length of the buried region, the distance between the emitter and collector regions being less than three minority carrier diffusion lengths to allow direct transistor action there between.

* * * * *